(12) United States Patent
Rajagopalan et al.

(10) Patent No.: US 12,116,271 B2
(45) Date of Patent: Oct. 15, 2024

(54) METHOD OF FORMING MONOCRYSTALLINE NICKEL-TITANIUM FILMS ON SINGLE CRYSTAL SILICON SUBSTRATES USING SEED LAYERS

(71) Applicants: Jagannathan Rajagopalan, Tempe, AZ (US); Rohit Berlia, Tempe, AZ (US)

(72) Inventors: Jagannathan Rajagopalan, Tempe, AZ (US); Rohit Berlia, Tempe, AZ (US)

(73) Assignee: Arizona Board of Regents on behalf of Arizona State University, Scottsdale, AZ (US)

( * ) Notice: Subject to any disclaimer, the term of this patent is extended or adjusted under 35 U.S.C. 154(b) by 147 days.

(21) Appl. No.: 17/819,409

(22) Filed: Aug. 12, 2022

(65) Prior Publication Data

US 2023/0052052 A1    Feb. 16, 2023

Related U.S. Application Data

(60) Provisional application No. 63/232,806, filed on Aug. 13, 2021.

(51) Int. Cl.
*C30B 25/18* (2006.01)
*B81B 7/00* (2006.01)
(Continued)

(52) U.S. Cl.
CPC ........ *B81C 1/00365* (2013.01); *B81B 7/0048* (2013.01); *C30B 25/06* (2013.01);
(Continued)

(58) Field of Classification Search
CPC ....... C30B 23/00; C30B 23/02; C30B 23/025; C30B 25/00; C30B 25/02; C30B 25/06;
(Continued)

(56) References Cited

U.S. PATENT DOCUMENTS 5,225,366 A * 7/1993 Yoder .................... C30B 25/14
117/936
5,893,949 A    4/1999 King et al.
(Continued)

FOREIGN PATENT DOCUMENTS

JP    2012-043941    3/2012

OTHER PUBLICATIONS

Ainslie, et al. publication entitled "Controlling shape memory effects in NiTi thin films on Ru seed layer," Sensors and Actuators A, vol. 294, pp. 133-139 (2019). (Year: 2019).*
(Continued)

*Primary Examiner* — Kenneth A Bratland, Jr.
(74) *Attorney, Agent, or Firm* — Snell & Wilmer L.L.P.

(57) ABSTRACT

A method of forming a monocrystalline nitinol film on a single crystal silicon wafer can comprise depositing a first seed layer of a first metal on the single crystal silicon wafer, the first seed layer growing epitaxially on the single crystal silicon wafer in response to the depositing the first seed layer of the first metal; and depositing the monocrystalline nitinol film on a final seed layer, the monocrystalline nitinol film growing epitaxially on the final seed layer in response to the depositing the monocrystalline nitinol film. The method can form a multilayer stack for a micro-electromechanical system MEMS device.

8 Claims, 6 Drawing Sheets

(51) Int. Cl.
- *B81C 1/00* (2006.01)
- *C30B 25/06* (2006.01)
- *C30B 29/52* (2006.01)
- *C30B 29/68* (2006.01)

(52) U.S. Cl.
CPC ............ *C30B 25/186* (2013.01); *C30B 29/52* (2013.01); *C30B 29/68* (2013.01); *B81B 2207/99* (2013.01); *B81C 2201/0133* (2013.01); *B81C 2201/0177* (2013.01)

(58) Field of Classification Search
CPC ....... C30B 25/16; C30B 25/165; C30B 25/18; C30B 25/183; C30B 25/186; C30B 29/00; C30B 29/10; C30B 29/52; C30B 29/68; C23C 16/00; C23C 16/02; C23C 16/0227; C23C 16/06; C23C 14/00; C23C 14/02; C23C 14/021; C23C 14/06; C23C 14/14; B81C 1/00365; B81C 2201/0133; B81C 2201/0177; B81B 7/0048; B81B 2207/99
USPC .... 117/84, 88–89, 94–95, 97, 101, 105–106, 117/937, 939
See application file for complete search history.

(56) References Cited

U.S. PATENT DOCUMENTS

| | | |
|---|---|---|
| 6,913,649 B2 | 7/2005 | Voutsas et al. |
| 10,385,440 B2 | 8/2019 | Rajagopalan et al. |
| 10,822,688 B2 | 12/2020 | Rajagopalan et al. |
| 2008/0182392 A1 | 7/2008 | Yeh et al. |

OTHER PUBLICATIONS

Buschbeck, et al. publication entitled "Full tunability of strain along the fcc-bcc bain path in epitaxial films and consequences for magnetic properties," Phys. Rev. Lett., vol. 103, p. 216101 (2009). (Year: 2009).*
Knick, et al. publication entitled "Rapid and low power laser actuation of sputter-deposited NiTi shape memory alloy (SMA) MEMS thermal bimorph actuators," Sensors and Actuators A: Physical, vol. 291, pp. 48-57 (2019). (Year: 2019).*
Greene LE, et al. General route to vertical ZnO nanowire arrays using textured ZnO seeds. Nano Lett. 2005;5:1231-1236.
USPTO; Requirement for Restriction dated Jan. 10, 2019 in U.S. Appl. No. 15/458,693.
USPTO; Notice of Allowance dated Apr. 12, 2019 in U.S. Appl. No. 15/458,693.
PCT; International Search Report and Written Opinion for PCT/US2015/059162, mailed Feb. 23, 2016.
PCT; International Preliminary Report on Patentability No. PCT/US2015/059162 dated May 16, 2017.
USPTO; Notice of Allowance dated Sep. 18, 2020 in U.S. Appl. No. 16/521,996.
Huang, Y., et al., "Advances in Ultrafine-Grained Materials", Materials Today, vol. 16, No. 3, pp. 85-93, Mar. 2013.
He, G., et al., "Novel Ti-base Nanostructure—Dendrite Composite with Enhanced Plasticity", Nature Materials, vol. 2, pp. 33-37, Jan. 2003.
Waitz, T., et al., "Martensitic Phase Transformations in Nanocrystalline NiTi Studied by TEM", Acta Materialia 52, pp. 137-147, 2004.
Padmaprabu, C., et al., "Microstructural Investigation of TiAl Thin Films Grown on (111) Oriented Silicon Substrate by DC Magnetron Sputtering", Scripta Materialia 44, pp. 1837-1840, 2001.
Padmaprabu, C., et al., "Microstructural Characterisation of TiAl Thin Films Grown by DC Magnetron Co-Sputtering Technique", Materials Letters 43, pp. 106-113, 2000.
Froes, FH,. et al., "Synthesis, Properties and Applications of Titanium Aluminides", Journal of Materials Science 27, pp. 5113-5140, 1992.
Suryanarayana, C., et al., "Nanostructured Titanium Aluminides", Materials Science and Engineering, A179/A180, pp. 108-111, 1994.
Suryanarayana, C., et al., "Compaction and Characterization of Mechanically Alloyed Nanocrystalline Titanium Aluminides", Metallurgical and Materials Transactions A, vol. 28A, pp. 293-302, Feb. 1997.
Froes, FH., "Titanium Aluminides: Science, Technology, Applications and Synthesis by Mechanical Alloying", Journal of Materials Science and Technology, vol. 10, pp. 251-262, 1994.
Izadi E, et al. Texture dependent strain rate sensitivity of ultrafine-grained aluminum films. Scr Mater. 2016;114:65-69.
Vopsaroiu M, et al. Deposition of polycrystalline thin films with controlled grain size. J Phys D Appl Phys. 2005;38:490-496.
Thompson CV. Structure evolution during processing of polycrystalline films. Annu Rev Mater Sci. 2000;30:159-190.
Petrov I, et al.Microstructural evolution during film growth. J Vac Sci Technol A Vac Surf Films. 2003;21:S117.
Buijnsters JG, et al. Metallic seed nanolayers for enhanced nucleation of nanocrystalline diamond thin films. J Phys Chem C. 2013;117:23322-23332.
Harp GR, et al. Seeded epitaxy of metals by sputter deposition. Appl Phys Lett. 1994;65:3063-3065.
Miller KT, et al. Highly oriented thin films of cubic zirconia on sapphire through grain growth seeding. J MaterRes. 1991;6:2387-2392.
Thompson CV. Grain growth in thin films. Annu Rev Mater Sci. 1990;20:245-268.
Wu X, et al. Extraordinary strain hardening by gradient structure. PNAS. 2014; 111:7197-7201.
Rajagopalan J, et al. Bauschinger effect in unpassivated freestanding nanoscale metal films. Scr Mater. 2008;59:734-737.
Rajagopalan J, et al. Plastic deformation recovery in freestanding nanocrystalline aluminum and gold thin films. Science. 2007;315:1831-1834.
Lee D, et al. Crystallization behavior upon heating and cooling in Cu 50 Zr 50 metallic glass thin films. Acta Mater. 2016;121:68-77.
Greer AL. Crystallization of amorphous alloys. Metall Mater Trans A. 1996;27:549-555.
Easton M, et al. Grain refinement of aluminum alloys: part I. The nucleant and solute paradigms—a review of the literature. Metall Mater Trans A. 1999;30: 1613-1623.
Mullins WW. The effect of thermal grooving on grain boundary motion. Acta Metall. 1958;6:414-427.
Wong CC, et al. Surface-energy driven secondary grain growth in thinAu films. Appl Phys Lett. 1986;48:335-337.
Vitos L, et al. The surface energy of metals. Surf Sci. 1998;411:186-202.
Yamaguchi M, et al. High-temperature structural intermetallics. Acta Mater. 2000;48:307-322.
Fu Y, et al. TiNi-based thin films in MEMS applications: a review. Sens Actuators A Phys. 2004;112:395-408.
Easton M, et al. Grain refinement of aluminum alloys: part II. Confirmation of, and a mechanism for, the solute paradigm. Metall Mater Trans A. 1999;30:1625-1633.
Sarkar R, et al. Revealing anelasticity and structural rearrangements in nanoscale metallic glass films using in situ TEM diffraction. Mater Res Lett. 2017;5:135-143.
Chu JP, et al. Deposition and characterization of TiNi-base thin films by sputtering.Mat Sci Eng A. 2000;277:11-17.
Chu JP, et al. Thin film metallic glasses: unique properties and potential applications. Thin Solid Films. 2012;520:5097-5122.
El Khakani Mae, et al. Hardness and Young's modulus of amorphous a-SiC thin films determined by nanoindentation and bulge tests. J Mater Res. 1994;9:96-103.
Rincón C, et al. Effects of carbon incorporation in tungsten carbide films deposited by r.f.magnetron sputtering: single layers and multilayers. Surf Coat Technol. 2003;163-164:386-391.

* cited by examiner

METHOD OF FORMING MONOCRYSTALLINE NICKEL-TITANIUM FILMS ON SINGLE CRYSTAL SILICON SUBSTRATES USING SEED LAYERS

CROSS-REFERENCE TO RELATED APPLICATIONS

This application is a non-provisional of, and claims priority to and the benefit of, U.S. Provisional Application No. 63/232,806 filed on Aug. 13, 2021 and entitled "MONOCRYSTALLINE NICKEL-TITANIUM FILMS ON SINGLE CRYSTAL SILICON SUBSTRATES USING SEED LAYERS." The disclosure of the foregoing application is incorporated herein by reference in its entirety, including but not limited to those portions that specifically appear hereinafter, but except for any subject matter disclaimers or disavowals, and except to the extent that the incorporated material is inconsistent with the express disclosure herein, in which case the language in this disclosure shall control.

TECHNICAL FIELD

The present disclosure relates to nanomaterials, and in particular to formation of monocrystalline thin films formed via epitaxial growth on seed layers deposited on a substrate.

BACKGROUND

Nickel Titanium ("nitinol" or "NiTi") is a shape memory metal alloy which can recover its initial shape after deformation upon heating. Due to its large recoverable strain (up to 10%) and high work output ($10^7$ J/m$^3$), nitinol films are widely used as sensors/actuators in micro-electromechanical systems ("MEMS") devices. However, the thermal shape memory effect in nitinol is suppressed when the grain size is below 50 nm. Hence, ultra-thin nitinol films, which typically have very fine grain sizes, are often unviable for MEMS applications even though they can enable much higher operating frequencies.

Even if the grain size is increased sufficiently by annealing to restore the shape memory effect, polycrystalline nitinol films have two other limitations: (1) the incompatible transformation strains between neighboring grains in polycrystalline nitinol films can lead to stress concentrations near grain boundaries, and can result in plastic deformation and incomplete strain recovery; and (2) the stress concentrations can induce fatigue cracks during thermal or mechanical cycling, which can ultimately lead to failure. Thus, improved nanocrystalline microstructures may be desirable.

SUMMARY

A method of forming a monocrystalline nitinol film on a single crystal silicon wafer is disclosed herein. In various embodiments, the method comprises: depositing a first seed layer of a first metal on the single crystal silicon wafer, with the first seed layer growing epitaxially on the single crystal silicon wafer; and depositing the monocrystalline nitinol film on a final seed layer, with the monocrystalline nitinol film growing epitaxially on the final seed layer. In various embodiments, the final seed layer is the first seed layer. In various embodiments, the first metal comprises iron.

In various embodiments, the method further comprises depositing a second seed layer of a second metal on the first seed layer to form the final seed layer, with the second seed layer growing epitaxially on the first seed layer. The first metal can be iron, and the second metal can be chromium. In various embodiments, the first seed layer has a first lattice mismatch with the monocrystalline nitinol film that is less than a second lattice mismatch between the monocrystalline nitinol film and the single crystal silicon wafer, and the second seed layer has a third lattice mismatch with the monocrystalline nitinol film that is less than a fourth lattice mismatch between the monocrystalline nitinol film and the first seed layer.

In various embodiments, the method further comprises etching, via a hydrofluoric acid (HF) etching process, a surface of the single crystal silicon wafer. In various embodiments, the method further comprises heating the monocrystalline nitinol film to an elevated temperature during its deposition. In various embodiments, the deposition of the monocrystalline nitinol film is performed via sputtering. In various embodiments, the first seed layer has lower lattice mismatch with the monocrystalline nitinol film than the single crystal silicon wafer.

A multilayer stack is disclosed herein. In various embodiments, the multilayer stack can comprise: a single crystal silicon wafer; a first seed layer; and a monocrystalline nitinol film, the first seed layer disposed between the single crystal silicon wafer and the monocrystalline nitinol film.

In various embodiments, the multilayer stack further comprises a second seed layer disposed between the first seed layer and the monocrystalline nitinol film. The first seed layer can comprise iron, and the second seed layer can comprise chromium. In various embodiments, the first seed layer is epitaxially grown on the single crystal silicon wafer, and the monocrystalline nitinol film is epitaxially grown on the first seed layer. In various embodiments, there is no oxide layer between the single crystal silicon wafer and the first seed layer.

A micro-electromechanical system (MEMS) device is disclosed herein. In various embodiments, the MEMS device comprises: a single crystal silicon wafer; and a monocrystalline nitinol film coupled to the single crystal silicon wafer. In various embodiments, the MEMS device further comprises a first seed layer disposed between the single crystal silicon wafer and the monocrystalline nitinol film, the first seed layer grown epitaxially on the single crystal silicon wafer. The MEMS device can further comprise second seed layer disposed between the first seed layer and the monocrystalline nitinol film, wherein the second seed layer is grown epitaxially on the first seed layer.

This section is intended as a simplified introduction to the disclosure, and is not intended to limit the scope of any claim.

BRIEF DESCRIPTION OF THE DRAWINGS

The subject matter of the present disclosure is particularly pointed out and distinctly claimed in the concluding portion of the specification. A more complete understanding of the present disclosure, however, may best be obtained by referring to the detailed description and claims when considered in connection with the following illustrative figures. In the following figures, like reference numbers refer to similar elements and steps throughout the figures.

DETAILED DESCRIPTION

Figure 1:
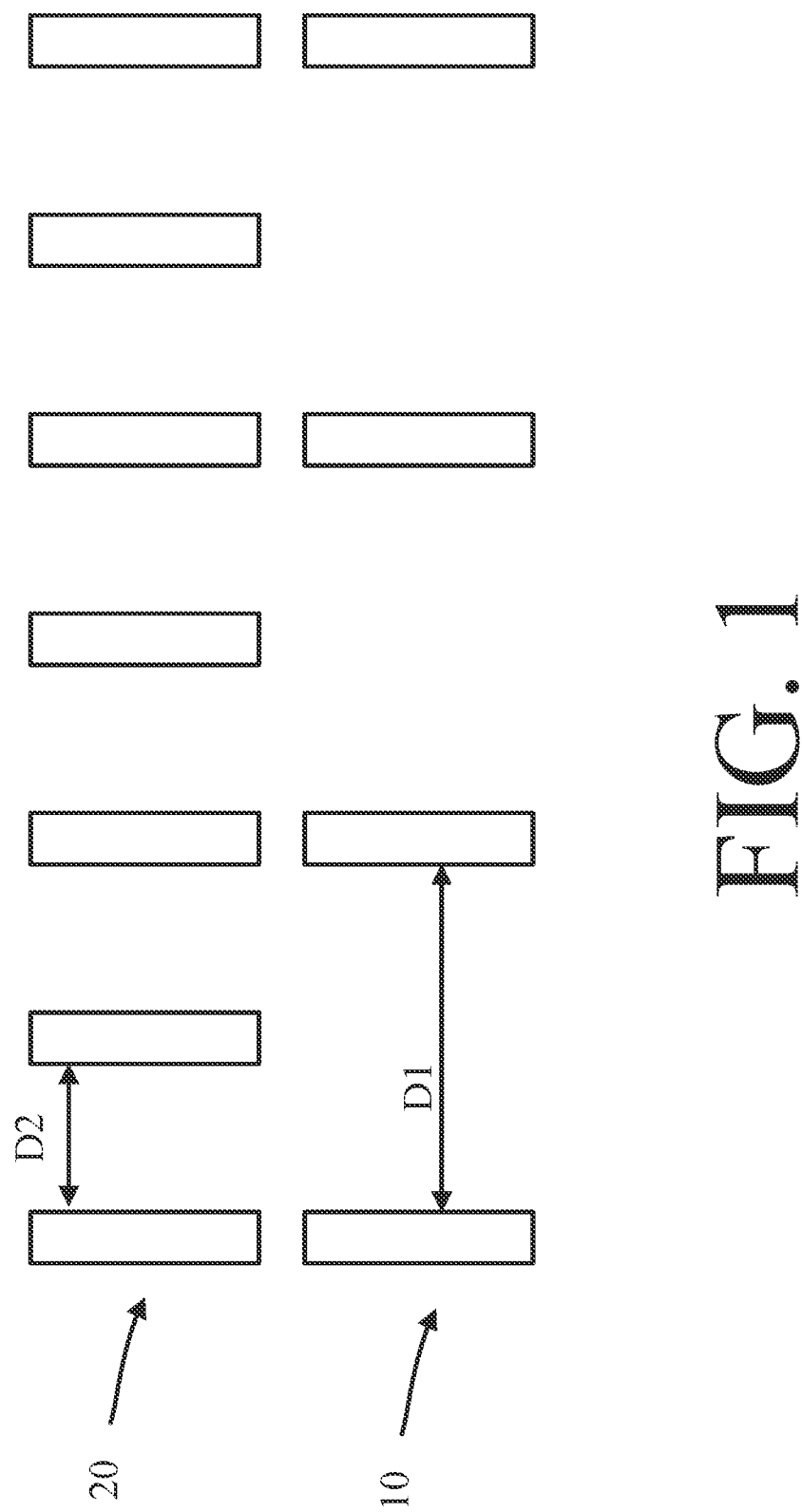
FIG. 1 illustrates an epitaxial relationship with a 2-to-1 coincidence site lattice between a substrate and a seed layer, in accordance with various embodiments.

The detailed description of exemplary embodiments herein makes reference to the accompanying drawings, which show exemplary embodiments by way of illustration. While these exemplary embodiments are described in sufficient detail to enable those skilled in the art to practice the principles of the present disclosure, it should be understood that other embodiments may be realized and that logical changes and adaptations in design and construction may be made in accordance with principles of the present disclosure. Thus, the detailed description herein is presented for purposes of illustration only and not of limitation. For example, steps recited in any of the method or process descriptions may be executed in any suitable order and are not necessarily limited to the order presented. Furthermore, any reference to singular includes plural embodiments, and any reference to more than one component or step may include a singular embodiment or step.

For the sake of brevity, conventional techniques for materials deposition, thermal processing, microstructure creation, crystalline engineering, and/or the like may not be described in detail herein. Furthermore, the connecting lines shown in various figures contained herein are intended to represent exemplary functional relationships and/or physical couplings between various elements. It should be noted that many alternative or additional functional relationships or physical connections may be present in a practical method for controlled microstructure creation or in materials or devices resulting therefrom.

Disclosed herein is a method to epitaxially grow nitinol films onto SCS substrates to form single crystal nitinol films with specific orientations. Single crystal nitinol films are used for applications in high frequency sensing and actuation in MEMS devices such as thermal switches, microgrippers, and micropumps. The method disclosed herein utilizes one or more carefully selected seed layers that have progressively better lattice matching with nitinol, thereby enabling nitinol to grow epitaxially on the topmost seed layer. Polycrystalline nitinol films are inferior and lead to plastic deformation, incomplete strain recovery, and fatigue cracks when used in sensors and actuators.

The problems associated with polycrystalline nitinol films may be circumvented if the nitinol film can be made monocrystalline (i.e., crystallized into a single crystal). Monocrystalline films can also have higher recoverable strain compared to polycrystalline nitinol films. Hence, it would be very beneficial to synthesize single crystal nitinol films on SCS wafers, which are the most commonly used substrates for MEMS devices.

Epitaxial growth of thin films is based on specific interface structures between crystal lattices of an epitaxial layer (i.e., a seed layer as described further herein) and the crystal lattices of a substrate (e.g., a base substrate or a prior seed layer). These interfaces can be characterized by a lattice mismatch defined by the following equations:

$$f = \frac{a_{sub} - a_{epi}}{a_{sub}}, \qquad \text{Eq. [1]}$$

where f is the lattice mismatch, as b is the lattice parameter of the substrate, and $a_{epi}$ is the lattice parameter of the epitaxial layer. Continuum elasticity theory indicates that for small misfits, the epilayer can be initially grown pseudomorphically (strained) on the substrate. However, as the epilayer thickness increases, its elastic strain increases until it is sufficient to activate misfit dislocation sources, after which plastic relaxation occurs. This critical thickness at which misfit dislocations are generated varies approximately inversely with f. For large misfit systems, the assumption of elasticity theory is no longer valid and the breakdown of epitaxial growth is expected. Indeed, for systems with a mismatch higher than ~15%, the growth often results in polycrystalline phase. Some exceptions of this rule are, however, found and can be explained by a coincidence site lattice (CSL).

For example, with reference now to FIG. 1, true coincidence between lattices of the epitaxial layer and lattices of a substrate would occur when:

$$\frac{D2}{D1} = \frac{m}{n}, \qquad \text{Eq. [2]}$$

where m and n are integers, D1 is an atomic distance of a substrate 10, and D2 is an atomic distance of an epitaxial layer 20. If m=n+1, for example, there is one extra lattice plane, i.e., a simple edge dislocation (misfit dislocation) in each unit cell of the coincidence lattice. The simple lattice-model shown in FIG. 1 illustrates this epitaxial relationship with a 2-to-1 coincidence site lattice between the epitaxial layer 20 and the substrate.

Thus, the coincidence lattice mismatch δ can be defined as.

$$\delta = \frac{m \cdot a_{sub} - n \cdot a_{epi}}{m \cdot a_{sub}}, \qquad \text{Eq. [3]}$$

In various embodiments, by reducing a coincidence lattice mismatch δ between an SCS substrate and a first seed layer as described further herein, one of a coincidence lattice mismatch δ or a lattice mismatch f can be reduced between the first seed layer and a nitinol film. When m=n, the equation for the coincidence lattice mismatch δ reduces to the basic equation for a lattice mismatch f. As such, "lattice mismatch" as referred to herein, refers to a coincidence lattice mismatch. In this regard, if a lattice mismatch is reduced, the lattice mismatch can be a coincidence lattice mismatch where m and n are equal integers, or where m and n are non-equal integers. However, the present disclosure is not limited in this regard.

In various embodiments, epitaxial growth of nitinol films on SCS wafers may be facilitated by the methods disclosed herein. For example, with reference now to FIG. 2, a method 100 of forming a monocrystalline nitinol film on an SCS wafer is illustrated, in accordance with various embodiments. The method 100 comprises etching a surface of an SCS substrate (step 101). In various embodiments, the surface can be etched via a hydrofluoric acid (HF) etching process. An "HF etching process", as described herein refers to a form of wet etching that uses hydrofluoric acid to etch out a native silicon dioxide on the SCS surface. In various embodiments, the removal of the native silicon dioxide layer by HF etching process can facilitate epitaxial growth and a greater bond between the SCS substrate and the first seed layer as described further herein. Although described herein as including an etching step in accordance with step 101, the present disclosure is not limited in this regard. For example, the method 100 can be performed without step 101 and still be within the scope of this disclosure.

The method 100 comprises depositing a first seed layer of a first metal on an SCS substrate (step 102). The first metal may comprise iron, copper, silver, or the like. In various embodiments, the first seed layer is deposited using sputtering, or any other suitable method known in the art. In various embodiments, the first metal comprises a body-centered cubic (BCC) crystal structure or a face centered cubic (FCC) crystal structure. In various embodiments, the first metal can comprise a BCC crystal structure, as a BCC crystal structure more closely matches the mating crystal structure of nitinol. For example, austenitic nitinol has a BCC crystal structure.

In various embodiments, the first metal may be configured to grow epitaxially on SCS. In this regard, the first metal can have a lattice mismatch with the SCS substrate that is less than the lattice mismatch between the nitinol film and the SCS substrate. Additionally, in various embodiments, the first metal can comprise a crystal structure that facilitates epitaxial growth, in accordance with various embodiments. As an SCS substrate comprises a diamond cubic crystal structure, the first metal can comprise a BCC crystal structure, an FCC crystal structure, or the like. Since a diamond cubic crystal structure includes an FCC lattice, an FCC crystal structure may be preferred over a BCC crystal structure for a similar lattice mismatch. However, if a lattice mismatch can be reduced for a BCC crystal structure relative to an FCC crystal structure, the BCC crystal structure may be preferable.

In various embodiments, the first seed layer from step 102 can comprise a coincidence lattice mismatch with a 2-to-1 coincidence site lattice for the SCS material that is less than the mismatch between a single crystal nitinol film and the SCS material. For example, based on Equation [3] above with an m to n ratio of 2:1, a coincidence lattice mismatch between an SCS material and iron is approximately 5.2%, and a coincidence lattice mismatch between an SCS material and chromium is approximately 6.1%, whereas a coincidence lattice mismatch between an SCS material and a nitinol film is approximately 10.85%. In this regard, a coincidence lattice mismatch with a 2-to-1 coincidence site lattice between the SCS substrate and the first seed layer and the SCS substrate can be less than 10%, or less than 8%, or less than 6.5%. Thus, the first metal from step 102 can be configured to grow epitaxially and facilitate a nitinol film to grow epitaxially thereon, or an additional seed layer to grow thereon.

In various embodiments, the first seed layer is not limited by a 2-to-1 coincidence site lattice. For example, a 4-to-3 coincidence site lattice could be facilitated by a silver metal, a 3-to-2 coincidence site lattice could be facilitated by copper, and other metals could potentially facilitate strong epitaxial growth and provide a better lattice mismatch with nitinol to facilitate epitaxial growth of a nitinol film thereafter. In various embodiments, a 1-to-1 coincidence facilitates greater epitaxial growth compared to a 2-to-1 coincidence with lattice mismatch otherwise being equal. Similarly, a 2-to-1 coincidence would likely facilitate greater epitaxial growth compared to a 4-to-3 coincidence with mismatch otherwise being equal. As such, in various embodiments, the first seed layer can comprise iron.

The method 100 further comprises depositing a second seed layer of a second metal on the first seed layer (step 104). The second metal may comprise chromium or the like. Similar to the first seed layer, the second seed layer may be configured to grow epitaxially on the first seed layer. In various embodiments, the second seed layer provides a progressively better lattice match with a nitinol film relative to the first seed layer. For example, if iron is used as the first seed layer, chromium could be used as the second seed layer. In this regard, a lattice mismatch between the seed layer and the nitinol film could be reduced from 5.1% to 4.3%. Additionally, since chromium has a close lattice parameter with iron, chromium could be grown epitaxially on the iron seed layer, in accordance with various embodiments. In various embodiments, if copper (e.g., having a lattice parameter of 3.5947 Å with an FCC crystal structure and a 3-to-2 coincidence site lattice) is used as the first seed layer, a second seed layer can comprise niobium (e.g., having a lattice parameter of 3.3008 Å) or tantalum (e.g., having a lattice parameter of 3.3058 Å and a BCC crystal structure), followed by a third seed layer of tungsten (e.g., having a lattice parameter of 3.155 Å and a BCC crystal structure) or molybdenum (e.g., having a lattice parameter of 3.142 Å and a BCC crystal structure). Thus, the method 100 can utilize heteroepitaxy to facilitate a top layer of a single crystal nitinol film that could not have been epitaxially grown on the SCS substrate, in accordance with various embodiments.

The method 100 further comprises depositing a nitinol film on the second seed layer (step 106). In this regard, the nitinol film is configured to grow epitaxially on the second seed layer and form a single crystal (i.e., a monocrystalline nitinol film), in accordance with various embodiments. In various embodiments, depositing the nitinol film during step 106 may be performed at elevated temperatures. In various alternative embodiments, depositing the nitinol film during step 106 may be performed at room temperature, followed by an annealing process at elevated temperatures.

The seed layers (i.e., first seed layer from step 102 and second seed layer from step 104) can be deposited either at room temperature or elevated temperature, in accordance with various embodiments. In some cases, only a single seed layer may be used, and nitinol can be deposited directly on the single seed layer. The present disclosure is not limited in this regard. In some cases, a third seed layer may be used, in accordance with various embodiments. Moreover, any suitable number of seed layers may be utilized, as desired.

Different orientations of the single crystal nitinol film can be obtained based on the orientation of the SCS wafer and the seed layers.

In various embodiments, by fabricating single crystal nitinol films on SCS wafers, the single crystal nitinol films are configured to have higher recoverable strain and better fatigue properties. In addition, the nitinol films can be made extremely thin (<100 nm), which can enable high frequency operation of MEMS sensors and actuators.

Nitinol does not grow epitaxially on SCS due to large lattice mismatch as described previously herein. In various embodiments, by utilizing one or more carefully selected seed layers that have progressively better lattice matching with nitinol, growing nitinol epitaxially on a topmost seed layer may be facilitated, in accordance with various embodiments.

Typical nitinol-based MEMS sensors and actuators use polycrystalline nitinol films which have the following disadvantages: (1) the incompatible transformation strains between neighboring grains in polycrystalline nitinol films can lead to stress concentrations near grain boundaries, and can result in plastic deformation and incomplete strain recovery and (2) the stress concentrations can induce fatigue cracks during thermal or mechanical cycling, which can ultimately lead to failure.

In addition, extremely thin nitinol films have very fine grain sizes which lead to the suppression of the shape memory effect. Therefore, they need to be annealed at fairly high temperatures to increase the grain size and restore the shape memory effect. The resultant monocrystalline microstructure formed from method 100 described above overcomes these disadvantages by synthesizing single crystal nitinol films at relatively low processing temperatures.

Referring now to FIG. 3, a multilayer stack 200 formed from method 100 of FIG. 1 is illustrated, in accordance with various embodiments. In various embodiments, the multilayer stack 200 comprises an SCS wafer 202, a first seed layer 204, a second seed layer 206, and a monocrystalline nitinol film 208. Although illustrated as comprising two seed layers 204, 206, the present disclosure is not limited in this regard. For example, the multilayer stack 200 may comprise any number of seed layers, in accordance with various embodiments. In various embodiments, the first seed layer 204 comprises one of iron, copper, or silver. In this regard, iron, copper, and silver may have better lattice matching with nitinol films relative to SCS as described previously herein. Thus, the first seed layer 204 may comprise a lattice mismatch with the SCS wafer 202 that is less than a lattice mismatch between the SCS wafer 202 and the monocrystalline nitinol film 208, in accordance with various embodiments.

In various embodiments, the second seed layer 206 can be chromium. In this regard, the second seed layer 206 may comprise a lower lattice mismatch with nitinol relative to the first seed layer 204 as described previously herein. Thus, lattice matching may progressively get better (i.e., a lattice mismatch with nitinol may decrease) with seed layers to facilitate epitaxially growing a monocrystalline nitinol film 208 on a SCS wafer 202. Similarly, the second seed layer 206 can comprise a lattice mismatch with the first seed layer 204 that is less than a lattice mismatch between the monocrystalline nitinol film 208 and the first seed layer 204. In this regard, a lattice mismatch for each layer and the monocrystalline nitinol film 208 can progressively be smaller as the layer is closer to the monocrystalline nitinol film, in accordance with various embodiments.

In various embodiments, a mating surface 203 of the SCS wafer 202 can comprise an HF etched surface, in accordance with step 101 of method 100. In this regard, the SCS wafer 202 may have no native oxide present on the mating surface 203.

Figure 3A:
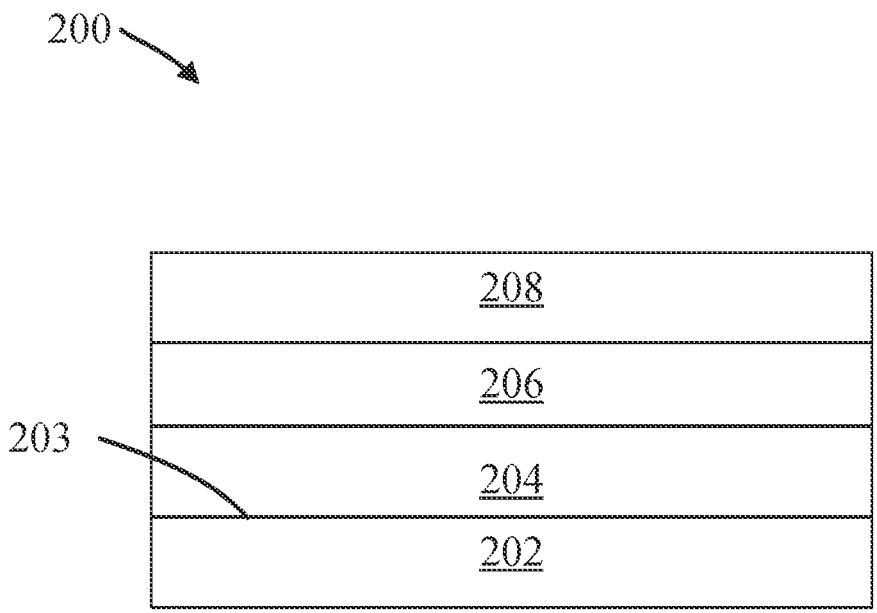
FIG. 3A illustrates a multilayer stack 200 comprised of two seed layers formed from method 100 of FIG. 2 in accordance with various embodiments.
Figure 3B:
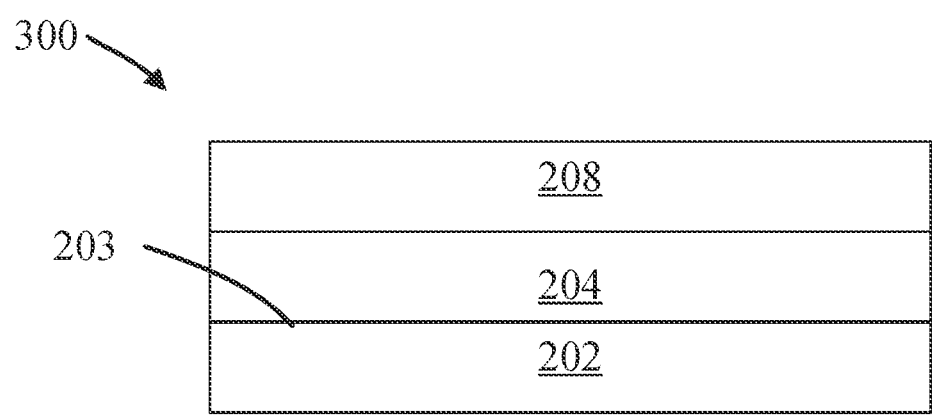
FIG. 3B illustrates a multilayer stack 300 comprised of one seed layer formed from method 100 of FIG. 2, in accordance with various embodiments.

Referring now to FIG. 3B, a multilayer stack 300 formed from method 100 is illustrated, in accordance with various embodiments. In various embodiments, the multilayer stack 300 can comprise a single seed layer (e.g., seed layer 204). In various embodiments, the single seed layer can comprise iron or chromium. However, the present disclosure is not limited in this regard. In various embodiments, the single seed layer comprises iron. In this regard, an interface between the single seed layer and the SCS wafer 202 can substantially be a 2-to-1 coincidence site lattice (e.g., having a low lattice mismatch as described previously herein).

Figure 4:
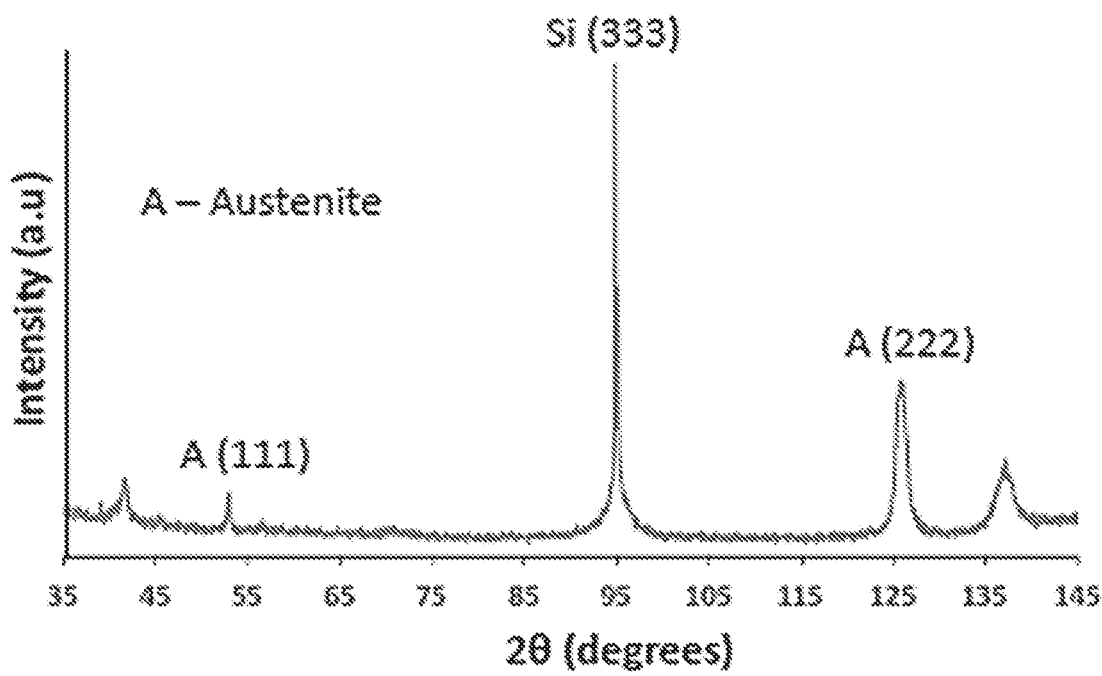
FIG. 4 illustrates an X-ray diffraction scan of a NiTi film grown on Cr/Fe seed layers deposited on HF-etched, bare SCS in accordance with various embodiments.
Figure 5:
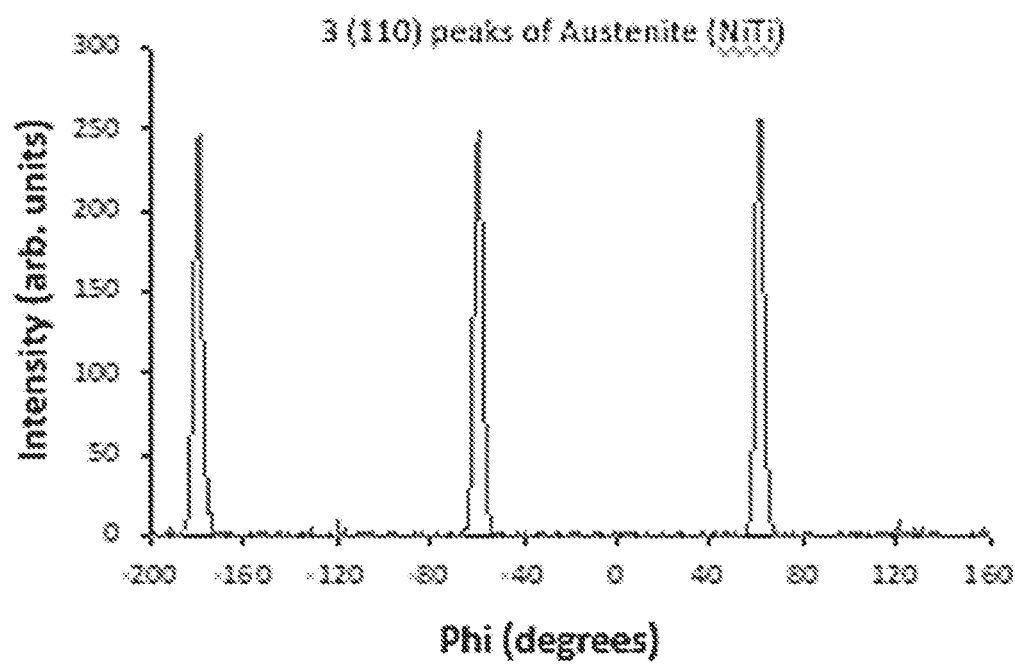
FIG. 5 illustrates an X-ray diffraction phi scan of a NiTi film grown on Cr/Fe seed layers deposited on HF-etched, bare SCS in accordance with various embodiments.

Referring now to FIGS. 4 and 5, an X-ray diffraction θ-2θ scan (FIG. 4) and an X-ray diffraction phi scan (FIG. 5) of a multilayer stack 200 from FIG. 3A with the monocrystalline nitinol film 208 formed on a second seed layer 206 of chromium, which was formed on a first seed layer 204 of iron, which was formed on an SCS wafer 202 where the (111) oriented SCS wafer is etched with hydrofluoric acid (HF) is illustrated, in accordance with method 100 from FIG. 1. The monocrystalline nitinol film shows a (111) texture, as evident from the A (111) and A (222) peaks. This happens because iron grows epitaxially on silicon (111), chromium grows epitaxially on iron, and nitinol grows epitaxially on chromium. So, a single crystal (i.e., monocrystalline) nitinol film 208 exhibits similar out-of-plane orientation as the SCS wafer 202 for the multilayer stack 200 of FIG. 3A, in accordance with various embodiments. The phi scan from FIG. 5 shows three sharp (110) peaks separated by approximately 120 degrees, which correspond to three (110) planes. The presence of just three (110) peaks indicates that the monocrystalline nitinol film 208 is a single crystal with a (111) out-of-plane orientation.

Figure 8:
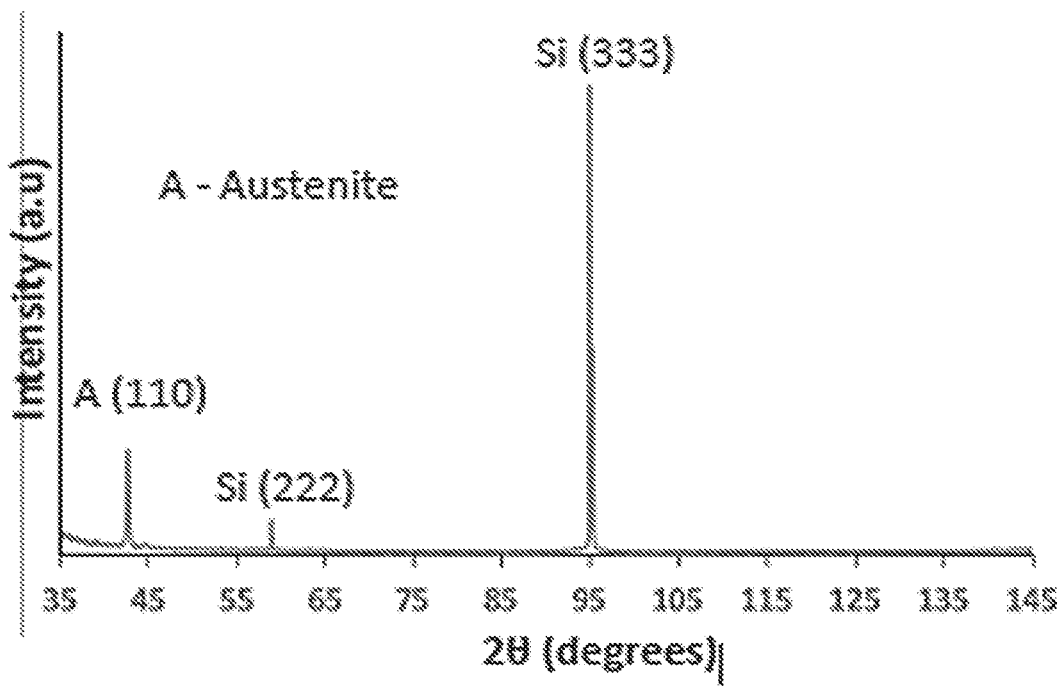
FIG. 8 illustrates an X-ray diffraction scan of a NiTi film grown on Cr/Fe seed layers deposited on SCS with an amorphous $SiN_x$ top layer in accordance with various embodiments.
Figure 9:
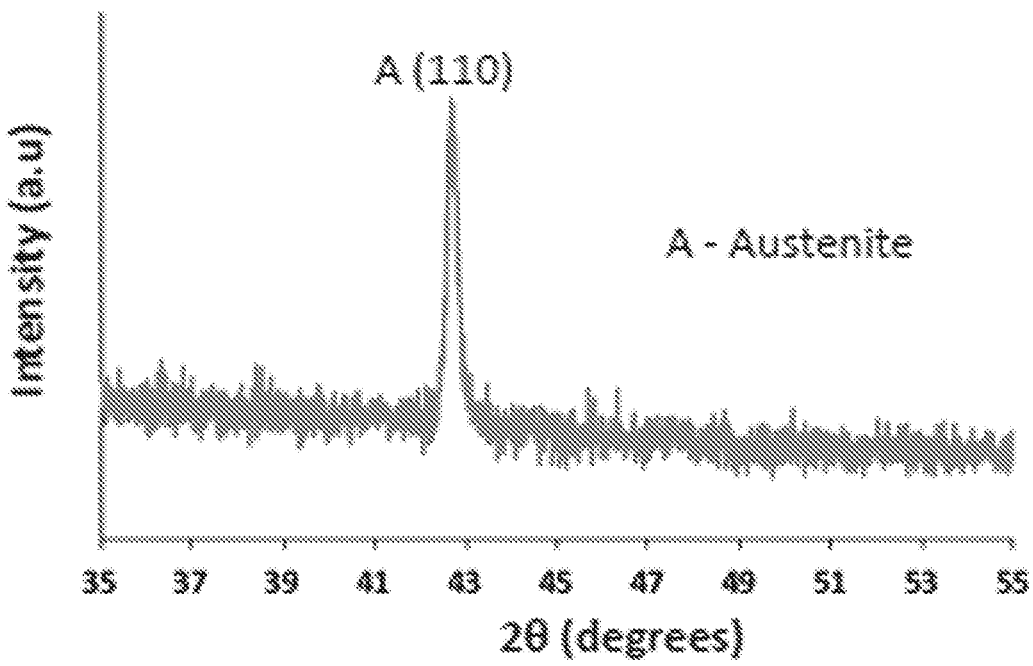
FIG. 9 illustrates an X-ray diffraction scan of a NiTi film grown on SCS with an amorphous $SiN_x$ top layer in accordance with various embodiments.

In contrast with the X-ray diffraction θ-2θ scan (FIG. 4) of the multi-layer stack 200 from FIG. 3A, and with brief reference to FIG. 8, a polycrystalline nitinol film generated on a similar stack to multi-layer stack 200 which deposited the seed layers on a silicon nitride top layer, shows an A(110) peak, which is the preferred texture of a nitinol film deposited on amorphous or polycrystalline substrates (i.e., as shown in FIG. 9 for a polycrystalline nitinol film grown on an SCS wafer with an amorphous silicon nitride top layer). Stated another way, the nitinol film of FIG. 8 has no epitaxial relationship with the Si wafer and is not a single crystal, which can be disadvantageous for the reasons provided previously herein.

Figure 2:
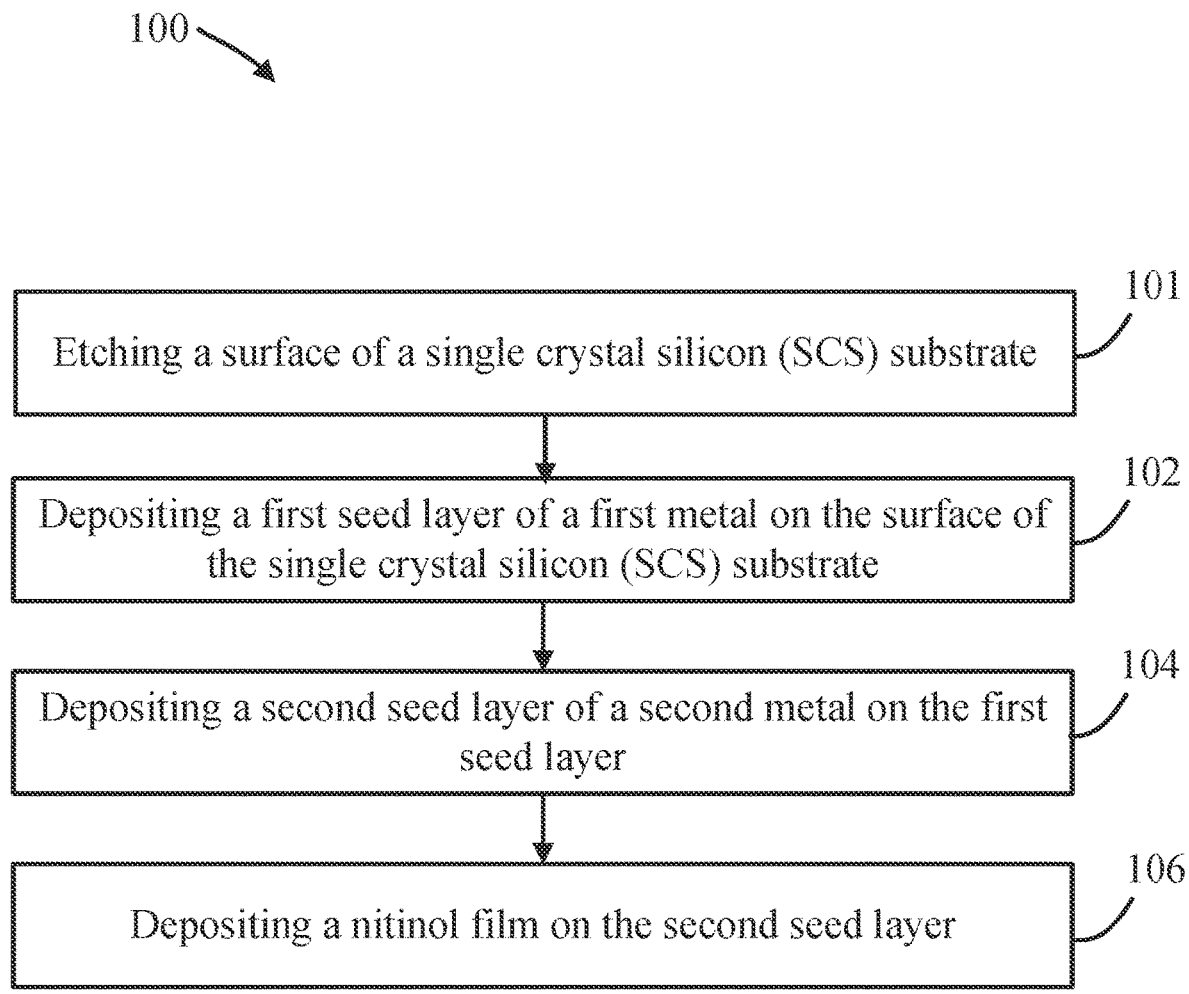
FIG. 2 illustrates a method of forming a monocrystalline nitinol film on a single crystal silicon ("SCS") wafer, in accordance with various embodiments.
Figure 6:
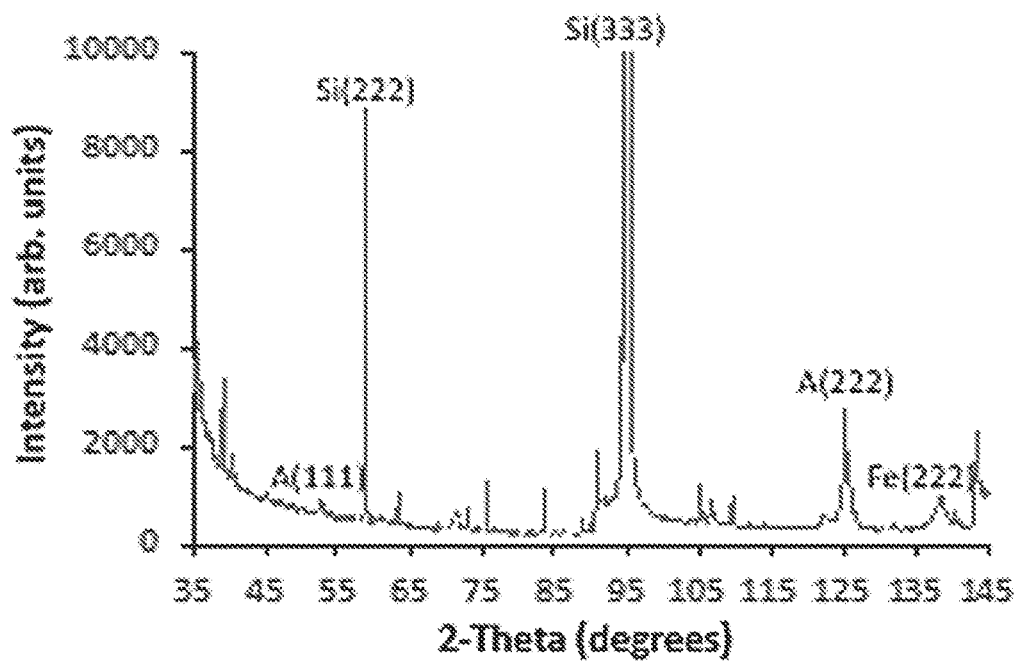
FIG. 6 illustrates an X-ray diffraction scan of a NiTi film grown on an iron seed layer deposited on an HF etched SCS wafer, in accordance with various embodiments.
Figure 7:
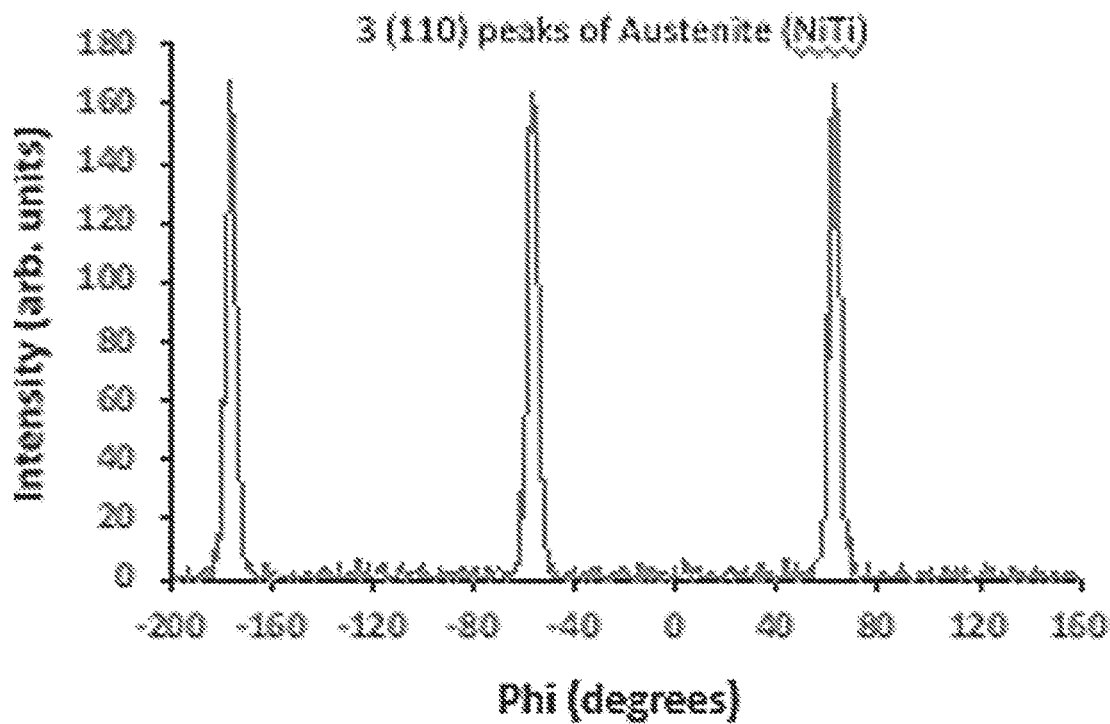
FIG. 7 illustrates an X-ray diffraction phi scan of a NiTi film grown on an iron seed layer deposited on an HF etched SCS wafer, in accordance with various embodiments.

Referring now to FIGS. 6 and 7, an X-ray diffraction θ-2θ scan (FIG. 6) and a phi scan (FIG. 7) of a multilayer stack 300 from FIG. 3B with the monocrystalline nitinol film 208 formed on a single seed layer 204 of iron, which was formed on an SCS wafer 202 where the (111) oriented SCS wafer is etched with hydrofluoric acid (HF) is illustrated, in accordance with method 100 from FIG. 2. The monocrystalline nitinol film 208 shows a (111) texture, as evident from the A (111) and A (222) peaks. This happens because iron grows epitaxially on silicon (111), and nitinol grows epitaxially on iron. So, a single crystal (i.e., monocrystalline) nitinol film 208 exhibits similar out-of-plane orientation as the SCS wafer 202 for the multilayer stack 300 of FIG. 3B, in accordance with various embodiments.

While the principles of this disclosure have been shown in various exemplary embodiments, many modifications of structure, arrangements, proportions, the elements, materials and components, used in practice, which are particularly adapted for a specific environment and operating requirements may be used without departing from the principles and scope of this disclosure. These and other changes or modifications are intended to be included within the scope of the present disclosure and may be expressed in the following claims.

Benefits, other advantages, and solutions to problems have been described herein with regard to specific embodiments. Furthermore, the connecting lines shown in the various figures contained herein are intended to represent exemplary functional relationships and/or physical couplings between the various elements. It should be noted that many alternative or additional functional relationships or physical connections may be present in a practical system. However, the benefits, advantages, solutions to problems, and any elements that may cause any benefit, advantage, or solution to occur or become more pronounced are not to be construed as critical, required, or essential features or elements of any embodiment. In the claims, reference to an element in the singular is not intended to mean "one and only one" unless explicitly so stated, but rather "one or more."

Moreover, when language similar to "at least one of A, B, or C" or "at least one of A, B, and C" is used in the specification or claims, the phrase is intended to mean any of the following: (1) at least one of A; (2) at least one of B; (3) at least one of C; (4) at least one of A and at least one of B; (5) at least one of B and at least one of C; (6) at least one of A and at least one of C; or (7) at least one of A, at least one of B, and at least one of C. The word "exemplary" is used herein to mean "serving as an example, instance or illustration". Any embodiment described as "exemplary" is not necessarily to be construed as preferred or advantageous over other embodiments and/or to exclude the incorporation of features from other embodiments.

Systems, methods and apparatus are provided herein. In the detailed description herein, references to "various exemplary embodiments", "one embodiment", "an embodiment", "an exemplary embodiment", etc., indicate that the embodiment described may include a particular feature, structure, or characteristic, but every embodiment may not necessarily include the particular feature, structure, or characteristic. Moreover, such phrases are not necessarily referring to the same embodiment. The word "exemplary" is used herein to mean "serving as an example, instance or illustration". Any embodiment described as "exemplary" is not necessarily to be construed as preferred or advantageous over other embodiments and/or to exclude the incorporation of features from other embodiments. Further, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments.

Furthermore, no element, component, or method step in the present disclosure is intended to be dedicated to the public regardless of whether the element, component, or method step is explicitly recited in the claims. No claim element herein is to be construed under the provisions of 35 U.S.C. 112(f), unless the element is expressly recited using the phrase "means for." As used herein, the terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method of forming a monocrystalline nitinol film on a single crystal silicon wafer, comprising:
    etching, via a hydrofluoric acid (HF) etching process, a surface of the single crystal silicon wafer;
    depositing a first seed layer of a first metal on the single crystal silicon wafer, with the first seed layer growing epitaxially on the single crystal silicon wafer, wherein the first metal is iron;
    depositing a second seed layer of a second metal on the first seed layer to form a final seed layer, with the second seed layer growing epitaxially on the first seed layer, wherein the second metal is chromium; and
    depositing the monocrystalline nitinol film on the final seed layer, with the monocrystalline nitinol film growing epitaxially on the final seed layer to form a deposited monocrystalline nitinol film with a thickness of less than 100 nm.

2. The method of claim 1, wherein:
    the first seed layer has a first lattice mismatch with the monocrystalline nitinol film that is less than a second lattice mismatch between the monocrystalline nitinol film and the single crystal silicon wafer, and
    the second seed layer has a third lattice mismatch with the monocrystalline nitinol film that is less than a fourth lattice mismatch between the monocrystalline nitinol film and the first seed layer.

3. The method of claim 1, further comprising heating the monocrystalline nitinol film to an elevated temperature during the depositing the monocrystalline nitinol film.

4. The method of claim 1, wherein the depositing the monocrystalline nitinol film is performed via sputtering.

5. The method of claim 1, wherein the first seed layer has lower lattice mismatch with the monocrystalline nitinol film than the single crystal silicon wafer.

6. The method of claim 1, wherein the first seed layer has a coincidence lattice mismatch with a 2-to-1 coincidence site lattice that is less than 10%.

7. The method of claim 6, wherein the first seed layer has the coincidence lattice mismatch with a 2-to-1 coincidence site lattice that is less than 8%.

8. The method of claim 1, wherein the deposited monocrystalline nitinol film is crystallized into a single crystal in response to the depositing the monocrystalline nitinol film on the final seed layer.

* * * * *